(12) United States Patent
Beaudoin

(10) Patent No.: US 6,811,471 B2
(45) Date of Patent: Nov. 2, 2004

(54) ABRASIVE PARTICLES TO CLEAN SEMICONDUCTOR WAFERS DURING CHEMICAL MECHANICAL PLANARIZATION

(75) Inventor: Stephen Beaudoin, West Lafayette, IN (US)

(73) Assignee: Arizona Board of Regents, Tempe, AZ (US)

( * ) Notice: Subject to any disclaimer, the term of this patent is extended or adjusted under 35 U.S.C. 154(b) by 0 days.

(21) Appl. No.: 10/455,129

(22) Filed: Jun. 5, 2003

(65) Prior Publication Data

US 2003/0228738 A1 Dec. 11, 2003

Related U.S. Application Data

(60) Provisional application No. 60/386,127, filed on Jun. 5, 2002.

(51) Int. Cl.[7] .................................................. B24B 7/04

(52) U.S. Cl. ............... 451/41; 156/345.31; 156/345.32; 451/41; 451/259; 451/285

(58) Field of Search ...................... 156/345.31, 345.32; 451/41, 259, 285, 533; 216/2

(56) References Cited

U.S. PATENT DOCUMENTS

| | | | |
|---|---|---|---|
| 5,129,919 A | | 7/1992 | Kalinowski et al. |
| 5,823,855 A | * | 10/1998 | Robinson .................... 451/41 |
| 5,879,222 A | * | 3/1999 | Robinson .................... 451/41 |
| 6,261,162 B1 | | 7/2001 | Hirokawa et al. |
| 6,413,153 B1 | * | 7/2002 | Molar ........................ 451/259 |
| 2002/0003225 A1 | | 1/2002 | Hampden-Smith et al. |
| 2003/0217811 A1 | * | 11/2003 | Jeong .................... 156/345.31 |
| 2004/0055993 A1 | * | 3/2004 | Moudgil et al. ............... 216/2 |

* cited by examiner

Primary Examiner—David Nelms
Assistant Examiner—Dao H. Nguyen
(74) Attorney, Agent, or Firm—Robert D. Atkins; Quarles & Brady Streich Lang LLP

(57) ABSTRACT

In a slurry solution for chemical mechanical planarization (CMP) of a semiconductor wafer, an abrasive particle is provided having a central body and a plurality of extensions from the central body of the abrasive particle. The plurality of extension hold a center of mass of the abrasive particle a distance from the semiconductor wafer during the CMP process. The extensions extend 3-dimensionally from the central body, with the length of one extension being about 30 nm. The extensions reduce attractive forces acting on the central body allowing the abrasive particles to be removed from the semiconductor wafer during a post-CMP cleaning process.

25 Claims, 3 Drawing Sheets

ABRASIVE PARTICLES TO CLEAN SEMICONDUCTOR WAFERS DURING CHEMICAL MECHANICAL PLANARIZATION

CLAIM TO DOMESTIC PRIORITY

The present non-provisional patent application claims priority to provisional application Ser. No. 60/386,127, entitled "Custom-designed Abrasive Particles to Minimize cleaning following Chemical Mechanical Planarization," and filed on Jun. 5, 2002, by Stephen Beaudoin.

GOVERNMENT LICENSE RIGHTS

The U.S. Government has a paid-up license in this invention, and the right in limited circumstances to require the patent owner to license others on reasonable terms, as provided for by the terms Grant No. CTS9984620 awarded by the National Science Foundation.

FIELD OF THE INVENTION

The present invention relates, in general, to semiconductor manufacturing and, more particularly, to abrasive particles used to clean semiconductor wafers during chemical mechanical planarization.

BACKGROUND OF THE INVENTION

Semiconductor devices are widely and commonly used in the construction of electronic circuits for many types of electronic products. The manufacturing of a semiconductor device typically involves growing a cylindrical-shaped silicon (or other base semiconductive material) ingot. The ingot is sliced into circular flat wafers. Through a number of thermal, chemical, and physical manufacturing processes, active semiconductor devices and passive devices are formed on one or both surfaces of the wafer. The wafer is cut into individual rectangular semiconductor die which are then mounted and attached to a leadframe, encapsulated, and packaged as discrete or integrated circuits. The packaged discrete and integrated circuits are mounted to a printed circuit board and interconnected to perform the desired electrical function.

One of the processes involved in the manufacture of the semiconductor wafer is a step known as chemical mechanical planarization or polish (CMP). The CMP process uses chemical reactions and mechanical buffing to remove excess material left on the surface of the wafer following formation of the active and passive devices, or during the interconnection of these devices. A slurry of abrasive particles, such as alumina, silica, or ceria particles, are suspended in a fluid, such as an aqueous solution or liquid or supercritical carbon dioxide, which contains additives that induce chemical changes on the wafer surface, including oxidation, dissolution, and passivation, or which may inhibit chemical changes on the wafer surface. Aqueous slurries may be acidic or basic in nature. The slurries are deposited on the surface of a polishing pad. The slurry chemically modifies the wafer surface. The mechanical buffing action removes the modified surface layer, as well as bulk material, including the removal of high points on the surface of the wafer. Following polishing, particles, which may have originated from the slurry, from the layers being polished, from the backside of the wafer, from the CMP apparatus, on the walls of a deposition chamber, on the walls of an etch chamber, or from a photoresist process, can be left on the wafer. In order to achieve extreme flatness on the wafer surface, the CMP process must exercise precise control over the polishing time, pressure of the wafer against the pad, pad-wafer relative velocity, slurry particle size, slurry feed rate, and composition of the slurry. The wafer receives a post-CMP cleaning process to remove as many particles as possible from the surface of the wafer. The cleaning process may involve wafer rotation, liquid cleaning solutions, supercritical fluids, ultrasonic or megasonic energy, brushes, laser energy, or particles of frozen gas.

Any particles that remain on the wafer surface following the CMP and cleaning processes can cause defects in the integrated circuit die. The particles that remain may be pieces of wafer material which did not get removed by the CMP and cleaning processes. The particles that remain may also be pieces of the abrasive particles used in the CMP slurry that broke off during the mechanical buffing, or were otherwise left behind following CMP and cleaning, or they may originate on the walls of the vessels that process the wafers. The primary particles of interest are the left over slurry particles following CMP.

In the semiconductor industry, manufacturers must address a significant concern of particle contamination on semiconductor wafers and integrated circuits. In general, a particle that is one-third the critical line width of the relevant technology can cause a defect and reduce production yield. The critical line width refers to the minimum construction geometry in the relevant technology. In some cases, the minimum construction geometry refers to a minimum effective gate width of a metal oxide semiconductor (MOS) transistor. In other cases, the minimum construction geometry refers to the width of a trench used in device interconnection.

In silicon-based technology for example, the present critical line width is approximately 0.25 microns. Work is under way to reduce that critical line width to 0.08–0.13 microns. The semiconductor industry has been and will continue to reduce the critical line width for all technologies in order to increase device density and electrical functions available for a given surface area of the die.

Any particle adhering to or left on the semiconductor wafer or integrated circuit die after the manufacturing process which approaches a size of about one-third of the critical line width, e.g. particles as small as 0.08 microns for 0.25 micron technology, can cause product contamination or a defect in the end device.

Although the contamination particles remaining after the CMP process do not adhere strongly to the surface of the wafer, the particles are so small that it is difficult to apply the necessary force to remove them. In the cleaning process following CMP where the wafer is flushed with a cleansing solution, the particles are so small and close to the wafer surface that the solution cannot assert much force to dislodge the contaminants. The use of cleaning brushes can damage the surface of the wafer and hydroplane over the top of the particles.

SUMMARY OF THE INVENTION

In one embodiment, the present invention is a slurry solution for chemical mechanical planarization (CMP) of a semiconductor wafer comprising an abrasive particle having a central body and a plurality of extensions from the central body of the abrasive particle. At least one of the plurality of extensions holds a center of mass of the abrasive particle a distance from the semiconductor wafer.

In another embodiment, the present invention is a method of manufacturing a semiconductor wafer, comprising providing a chemical mechanical planarization (CMP) on the semiconductor wafer with a slurry solution comprising an abrasive particle having a central body and a plurality of extensions from the central body of the abrasive particle. At least one of the plurality of extensions holds a center of mass of the abrasive particle a distance from the semiconductor wafer.

DETAILED DESCRIPTION OF THE DRAWINGS

Semiconductor devices are widely and commonly used in the construction of electronic circuits for many types of electronic products. The manufacturing of a semiconductor device typically involves growing a cylindrical-shaped silicon (or other base semiconductive material) ingot. The ingot is sliced into circular flat wafers. Through a number of thermal, chemical, and physical manufacturing processes, active semiconductor devices and passive devices are formed on one or both surfaces of the wafer, and are interconnected. The wafer is cut into individual rectangular semiconductor die which are then mounted and attached to a leadframe, encapsulated, and packaged as discrete or integrated circuits. The packaged discrete and integrated circuits are mounted to a printed circuit board and interconnected to perform the desired electrical function.

Figure 1:
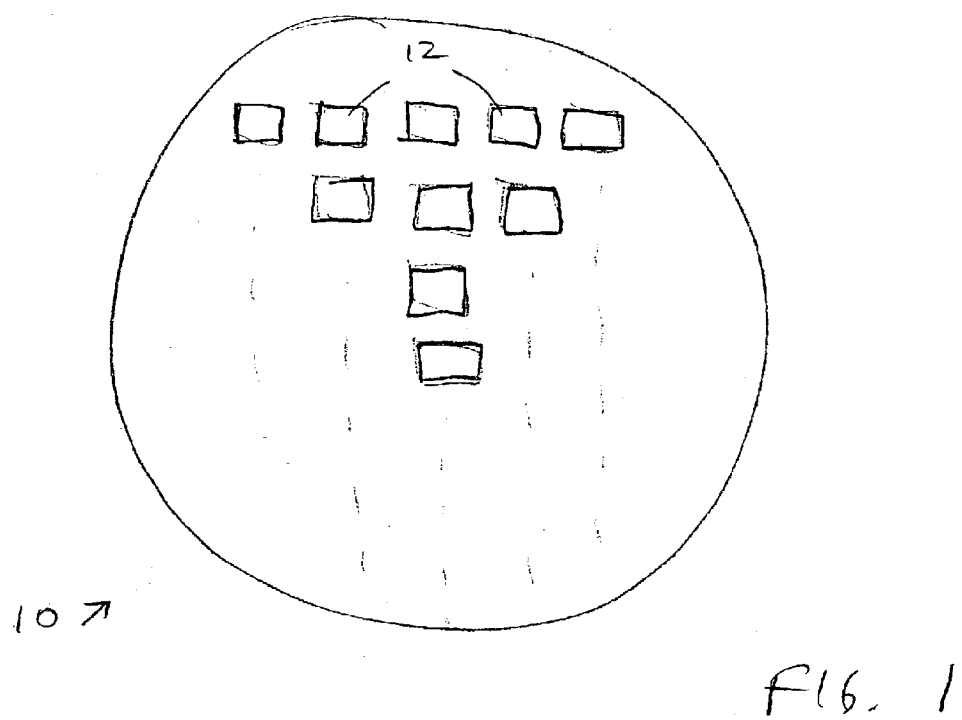
FIG. 1 illustrates a semiconductor wafer comprising semiconductor die.

FIG. 1 illustrates a semiconductor wafer 10 comprising a number of die 12. Die 12 are manufactured to comprise one or more semiconductor devices. Each die 12 is cut from the wafer, mounted on a leadframe, encapsulated in a package, and sold as a discrete or integrated circuit chip. Die are also used in "Flip Chip" applications, in which they are directly bonded to the circuit board without the leadframe.

The semiconductor manufacturing process may begin with a rough polish to smooth the surface and remove any irregularities. To form the active and passive devices, the semiconductor wafer undergoes a layering process in which material is grown by oxidation or nitridation, or deposited by sputtering, evaporation, or chemical vapor deposition (CVD), on the surface of the wafer. The layering process further deposits metalization layers to interconnect the semiconductor devices. It is common to have five to six layers of metal in complex wafer designs. The semiconductor wafer receives a patterning process to remove selected portions of the previously grown or deposited material. Patterning can be implemented using photolithography, photomasking, and microlithography techniques and may involve application of photoresist and etching away of excess material. The layering and patterning processes are applied over and over again in order to form individual transistors, diodes, and other devices. In many cases, the patterning process defines the critical line dimensions of the wafer. The wafer is subjected to a doping process to inject certain quantities of dopants into the semiconductor devices to alter their electrical characteristics. Dopants can be injected by thermal diffusion or ion implantation.

Semiconductor wafers have a critical line width associated with the relevant technology. In silicon-based technology, the present critical line width is approximately 0.25 microns. Work is under way to reduce that critical line width to 0.08–0.13 microns. The semiconductor industry has been and will continue to reduce the critical line width for all technologies in order to increase the device density and electrical functions available for a given surface area of the die. The small geometries and precision manufacturing requirements mandate that the surface of semiconductor wafer 10 be made as flat as possible.

Accordingly, once the devices are formed, semiconductor wafer 10 undergoes chemical mechanical planarization or polish (CMP) to remove excess material left over from the layering and patterning processes. The CMP process involves chemical etching, chemical reactions, and mechanical buffing. Semiconductor wafer 10 is mounted in a carrier and brought into contact with a pad surface. The pad and wafer move in opposing rotation, relative to each other while in contact. The pad is commonly made of polyurethane. A slurry of abrasive particles are suspended in a fluid and deposited on the pad surface. The fluid may be an aqueous solution which may have basic or acidic pH, or it may be liquid or supercritical carbon dioxide. The abrasive particles typically are alumina, silica, or ceria. The wafer is pressed against the pad in a controlled manner. The slurry chemically modifies the wafer surface. The mechanical buffing action removes the surface layers of the wafer along with high points on the surface of the wafer. The high points in the wafer surface include left over particles and other debris from the layering and patterning processes, and topography resulting from multiple deposition and etching steps. The left over particles may originate in the slurry, in the wafer surface material, on the walls of the deposition or etching chamber or from the photoresist process. The abrasive particles in the slurry strip material off the wafer surface. In order to achieve extreme flatness on the wafer surface, the CMP process must exercise precise control over the polishing time, pressure of the wafer against the pad, speed of the pad-wafer relative motion, slurry particle size, slurry feed rate, and chemistry of the slurry. The wafer receives a post-CMP cleaning process to remove as many particles as possible from the surface of the wafer.

In the semiconductor industry, manufacturers must address a significant concern of particle contamination on semiconductor wafers. In general, a particle that is one-third the critical line width of the relevant technology can cause a defect and reduce production yield. The critical line width refers to the minimum construction geometry in the relevant technology. In some cases, the minimum construction geometry refers to a minimum effective gate width of a metal oxide semiconductor (MOS) transistor. In other cases, the minimum construction geometry refers to the width of a trench interconnecting devices on the wafer.

Any particles that remain on the wafer surface following the CMP and cleaning processes can cause defects in the integrated circuit chip. The particles that remain may be pieces of wafer material which-did not get removed by the CMP and cleaning processes. The particles may also be pieces of the abrasive particles used in the CMP slurry, or pieces of the polyurethane pad that broke off during the mechanical buffing, or other contaminants that were otherwise left behind following CMP and cleaning. Any particle adhered to or left on semiconductor wafer 10 or the integrated circuit die during the manufacturing process which approaches a size of about one-third of the critical line width, e.g. particles as small as 0.08 microns for 0.25 micron technology, can cause product contamination or a defect in the end device.

There are a number of forces and mechanisms which cause particles to cling or adhere to the surface of semiconductor wafer 10 despite attempts to remove them. The particles may adhere to the wafer surface by (1) chemical bond, (2) nature of being suspended in cleaning solution that remains on the wafer surface, (3) electrostatic forces, and (4) van der Waals forces. The van der Waals forces are attributed to dipole interaction between atoms. Most atoms, including those found in semiconductor material and manufacturing processes, have a permanent dipole, although van der Waals interactions may act between permanent and induced dipoles, or between induced dipoles and induced dipoles.

The van der Waals forces are always attractive and act upon particles that are close to the wafer surface, for example in the range of say 30 nanometers (nm) or less, or embedded in the wafer surface. The permanent dipole of atoms in the material of the semiconductor wafer will attract the permanent dipole of the atoms of particles on or near the wafer surface to cause the loose material to adhere to the wafer. If there is a permanent dipole in only one of the two surfaces, the permanent dipole will induce a dipole in the other surface and create the attractive force. If there is no permanent dipole in either surface, then the action of the electron motion about the nucleus of the atom will create transient dipoles that will cause the particle to adhere to the wafer surface.

The magnitude of the van der Waals force is dependent in part on the mass of the particle in proximity to the wafer surface, the composition of the particle, the wafer surface, and any intervening medium, and the distance from the center of mass of the particle to the wafer surface. The attractive van der Waals forces reduce with increasing distance from the surface of the wafer. The attractive van der Waals forces also reduce with a reduction in the effective particle mass near the surface of the wafer.

For particles farther away from the wafer surface, there is an electrostatic force induced by charges on the particle and the wafer surface which may cause the particle to adhere to the semiconductor wafer, or may cause the surface to repel the particle. The electrostatic forces are typically stronger than the van der Waals forces at separation distances greater than about 30 nm, while the van der Waals forces are typically stronger than electrostatic forces at separation distances less than about 30 nm.

The post-CMP cleaning processes are intended to break most, if not all, of the forces holding loose particles to semiconductor wafer 10. The goal is to remove as many particles as possible to eliminate contamination and leave as smooth and as flat of a surface for the wafer as possible. The more particles that are removed, the fewer contaminants remain to cause defects in the die. However, if the magnitude of force require to remove any particular particle is greater than the cohesive energy of the particle, then the particle may separate or break apart leaving a portion of the particle still adhering to semiconductor wafer 10. If the magnitude of the force required to remove any particular particle is greater than the cohesive energy of the surface, the part of the surface will be pulled off the wafer with the particle, leaving a rough surface.

Figure 2:
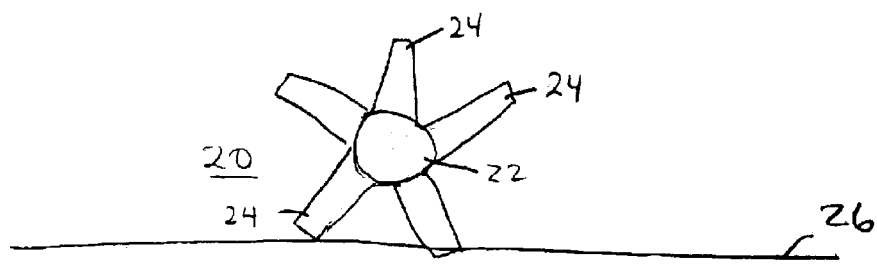
FIG. 2 illustrates an abrasive particle to be contained with slurry for CMP processing.

A feature of the present invention is to provide an abrasive particle, to be contained within the slurry used for the CMP process, which has a shape that tends to hold the majority of the mass of the particle farther from the surface of semiconductor wafer 10. An abrasive particle 20 is shown in FIG. 2 having a central body or portion 22 and a number of extensions or arms 24 extending from central body 22. Particle 20 has a 3-dimensional, symmetrical star shape in that, irrespective of its orientation, one or more of extensions 24 will separate or hold-off body 22 from wafer surface 26. In other words, the extensions 24 extend from body 22 in a symmetrical manner in all directions so that body 22 is held off any surface that particle 20 comes in contact with by at least the length of extension 24. The mass of particle 20 is in the range of $10^{-15}$ to $10^{-17}$ grams. The overall width of particle 20 is in the sub-micron range, between 10–150 nm across. The extensions 24 are greater than 30 nm. Accordingly, central body 22, or the center of mass of particle 20, is held more than 30 nm off wafer surface 26.

The central body 22 may be a material structure within abrasive particle 22 where the majority of the mass and the center of mass of particle 20 is located in or around body 22. The central body 22 may be just a portion of abrasive particle 20 where the plurality of extensions 24 intersect, come together, or otherwise have in common. In either case, the purpose of the extensions 24 is to hold the majority of mass of abrasive particle 20 a distance from wafer surface 26 greater than the minimum van der Waals interaction. The mass of the extensions 24 in contact with wafer surface 26 or otherwise within the minimum van der Waals interaction are consider negligible in terms of any attractive force that would hold the abrasive particle to wafer surface 26. The net effect is to remove or reduce the overall attractive van der Waals forces acting on abrasive particle 20 to allow the post-CMP cleaning process to remove the particle.

During the CMP process, the particle extensions 24 will come in contact with wafer surface 26 in the mechanical buffing or scraping action to polish wafer surface 26 and remove the oxide and other high points on the surface of semiconductor wafer 10 left over semiconductor material from the layering and patterning processes. If any particles 20 remain on wafer surface 26 following the CMP process, the attractive forces causing the particles to adhere to the wafer surface will be reduced because of the shape of the particles 20. The extensions 24 protruding from body 22 hold the center of mass of particle 20 at least the minimum van der Waals distance away from wafer surface 26. The van der Waals forces on particles 20 will be reduced or will become negligible thereby allowing the post-CMP cleaning process to remove more of the particles on wafer surface 26.

The extensions 24 of abrasive particle 20 may wear to some degree during CMP, but symmetrical or uniform construction of particle 20 will cause the wear of extensions 24 to be evenly distributed. The extensions 24 will maintain a minimum length to hold body 22 off wafer surface 26 and still maintain a less than minimum effect of the van der Waals interaction.

With the center of mass of particles 20 being held a distance from wafer surface 26, the van der Waals forces become less of a concern. However, as described above, the electrostatic forces may become more prominent. By adjusting the cleaning or polishing solution composition, the electrostatic forces can be neutralized or made to be repulsive. In other words, the cleaning solution composition can be altered so that there is an electrostatic repulsion between the particle and the wafer surface, and in the absence of strong van der Waals forces, this interaction will be adequate to desorb or repel particles from the wafer surface. At the same time, when the van der Waals forces are reduced in this fashion, less mechanical force is required to dislodge particles. The electrostatic force can be controlled by the pH and ionic strength of the slurry if an aqueous solutions is applied. For example, depending on the composition of particles 20, the pH and ionic strength of the slurry solution can be set to cause the electrostatic forces to repel. For particles 20 made from silica, and extensions 24 being about 30 nm in length, a pH of the slurry less than 3 will negate or create repulsive effect for the electrostatic forces on left over particles on wafer surface 26. The net result is more loose particles on the surface of semiconductor wafer 10 will be removed in the post-CMP cleaning process.

Figure 3:
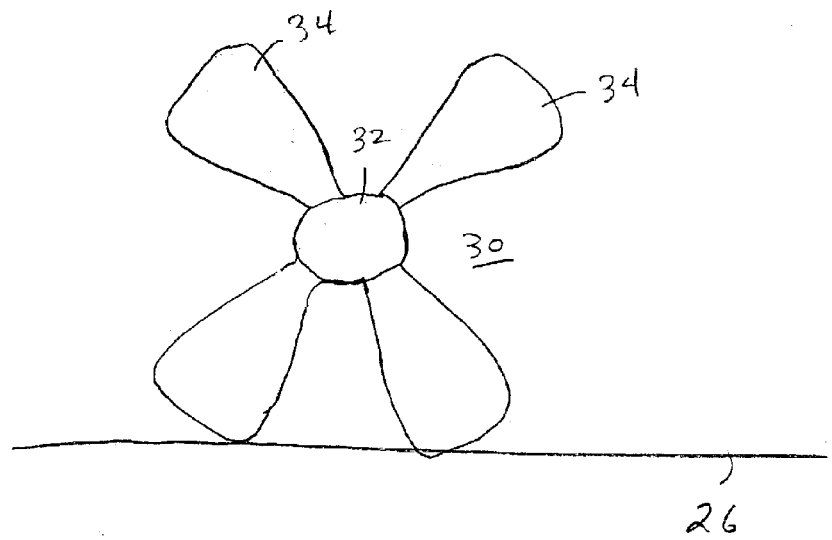
FIG. 3 illustrates another embodiment of the abrasive particle.

An alternate embodiment of the abrasive particle is shown in FIG. 3. Abrasive particle 30 includes central body 32 and extensions or arms 34 which are intended to keep the center of mass of central body 32 at least a minimum van der Waals distance away from semiconductor wafer surface 26. The extensions 34 are fewer in number and broader at the wafer contact point as compared to particle 20 to provide more abrasive strength per extension.

Figure 4:
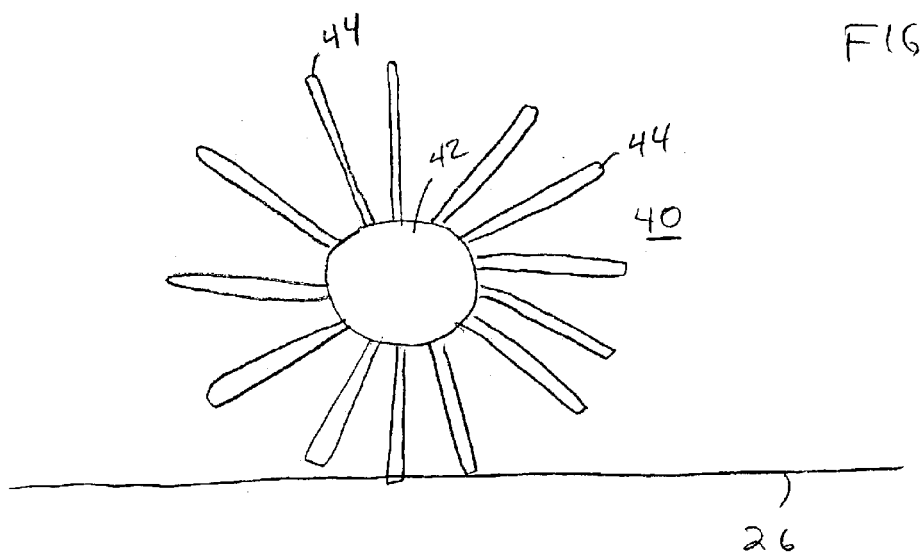
FIG. 4 illustrates another embodiment of the abrasive particle.

Another embodiment of the abrasive particle is shown in FIG. 4. Abrasive particle 40 includes central body 42 and extensions or arms 44 which are intended to keep the center of mass of central body 42 at least a minimum van der Waals distance away from semiconductor wafer surface 26. The needle-like extensions 44 are greater in number at the wafer contact point as compared to particle 20 to distribute the abrasive action between more extensions.

Figure 5:
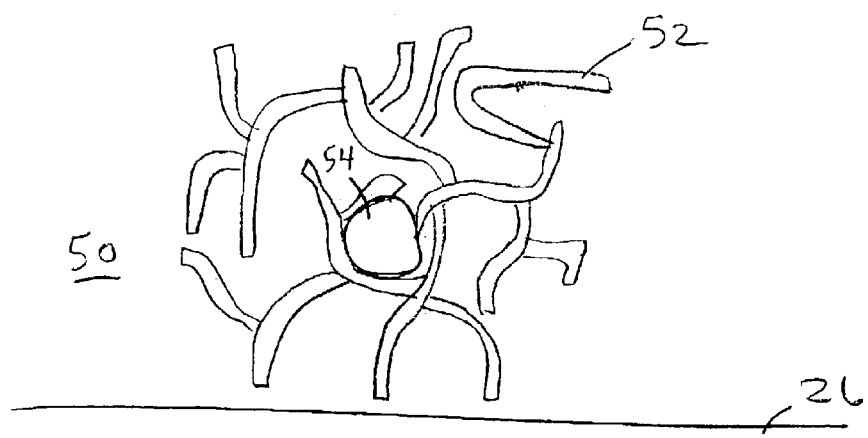
FIG. 5 illustrates yet another embodiment of the abrasive particle.

In yet another embodiment, as shown in FIG. 5, an abrasive particle 50 comprises a 3-dimensional network of extensions or arms 52. The network of extensions 52 may originate from or be connected to a central body 54, or the network of extensions may exist without any distinguishable central body, e.g. similar to a random crystalline structure or a snow-flake. The network of extensions 52 may be formed in a predetermined pattern or be random in nature. In either case, the network of extensions 52 keep the center of mass of the abrasive particle at least a minimum van der Waals distance away from semiconductor wafer surface 26 to neutralize the effects of the attractive van der Waals forces.

The abrasive particles can be manufactured by creating a template of the star-shaped or needle-like structure. The process would begin with a spherical shaped base particle substrate. The base particle substrate would receive a nano-patterning of the desired 3-dimensional configuration of the extensions. Portions of the base substrate would be etch, burned, or dissolved away according to the nano-pattern to leave the desired shape for the abrasive particle. Another manufacturing technique may involve micro-machining where portions of a spherical shaped base particle substrate are cut away again to yield the desire 3-dimensional shape for the abrasive particle. Yet another manufacturing technique uses crystalline growth that begins with a base body. The base body is seeded to allow random or structured crystalline growth in all directions to form the desired configuration for the extensions.

The present invention has been described with respect to preferred embodiment(s). Any person skilled in the art will recognize that changes can be made in form and detail, and equivalents may be substituted for elements of the invention without departing from the spirit and scope of the invention. Many modifications may be made to adapt to a particular situation or material to the teaching of the invention without departing from the essential scope of the invention. Therefore, it is intended that the invention not be limited to the particular embodiments disclosed for carrying out this invention, but that the invention will include all embodiments falling within the scope of the following claims.

What is claimed is:

1. A slurry solution for chemical mechanical planarization (CMP) of a semiconductor wafer, comprising an abrasive particle having a central body and a plurality of extensions from the central body of the abrasive particle, wherein at least one of the plurality of extensions holds a center of mass of the abrasive particle a distance from the semiconductor wafer.

2. The slurry solution of claim 1 wherein the plurality of extensions from the abrasive particle extend 3-dimensionally from the central body.

3. The slurry solution of claim 1 wherein a length of one extension is greater than 30 nanometers.

4. The slurry solution of claim 1 wherein the plurality of extensions from the abrasive particle reduce attractive forces acting on the abrasive particle.

5. The slurry solution of claim 4 wherein the abrasive particle is removed from the semiconductor wafer during a cleaning process.

6. The slurry solution of claim 1 wherein the abrasive particle is made of alumina, silica, or ceria.

7. The slurry solution of claim 6 wherein a pH of the slurry solution is adjusted to reduce electrostatic forces acting on the abrasive particle.

8. In a slurry solution, an abrasive particle for use in chemical mechanical planarization (CMP) of a semiconductor wafer, comprising:

a central body of the abrasive particle; and a plurality of extensions extending from the central body, wherein at least one of the plurality of extensions holds the central body a distance from the semiconductor wafer.

9. The abrasive particle of claim 8 wherein the plurality of extensions extend 3-dimensionally from the central body.

10. The abrasive particle of claim 8 wherein a length of one of the plurality of extensions is greater than 30 nanometers.

11. The abrasive particle of claim 8 wherein the plurality of extensions reduce attractive forces acting on the abrasive particle.

12. The abrasive particle of claim 11 wherein the abrasive particle is removed from the semiconductor wafer during a cleaning process.

13. A slurry solution for chemical mechanical planarization (CMP) of a semiconductor wafer, comprising an abrasive particle having a network of extensions, wherein the network of extensions holds a center of mass of the abrasive particle a distance from the semiconductor wafer.

14. The slurry solution of claim 13 wherein the abrasive particle includes a central body to which the network of extensions connect.

15. The slurry solution of claim 14 wherein the network of extensions from the abrasive particle extend 3-dimensionally from the central body.

16. The slurry solution of claim 13 wherein the network of extensions from the abrasive particle reduce attractive forces acting on the abrasive particle.

17. The slurry solution of claim 13 wherein the abrasive particle is made of alumina, silica, or ceria.

18. The slurry solution of claim 17 wherein a pH of the slurry solution is adjusted to reduce electrostatic forces acting on the abrasive particle.

19. A slurry solution for chemical mechanical planarization (CMP) of a semiconductor wafer, comprising an abrasive particle having a central body and a network of extensions from the central body, wherein at least one of the extensions holds a center of mass of the abrasive particle a distance from the semiconductor wafer.

20. The slurry solution of claim 19 wherein the network of extensions from the abrasive particle extend 3-dimensionally from the central body.

21. The slurry solution of claim 19 wherein a length of one extension is greater than 30 nanometers.

22. The slurry solution of claim 19 wherein the network of extensions from the abrasive particle reduce attractive forces acting on the abrasive particle.

23. The slurry solution of claim 19 wherein the abrasive particle is removed from the semiconductor wafer during a cleaning process.

24. The slurry solution of claim 19 wherein the abrasive particle is made of alumina, silica, or ceria.

25. The slurry solution of claim 19 wherein a pH of the slurry solution is adjusted to reduce electrostatic forces acting on the abrasive particle.

* * * * *